(12) United States Patent
Breitwisch et al.

(10) Patent No.: US 8,030,130 B2
(45) Date of Patent: Oct. 4, 2011

(54) PHASE CHANGE MEMORY DEVICE WITH PLATED PHASE CHANGE MATERIAL

(75) Inventors: Matthew J. Breitwisch, Yorktown Heights, NY (US); Eric A. Joseph, White Plains, NY (US); Alejandro G. Schrott, New York, NY (US); Xiaoyan Shao, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 12/541,595

(22) Filed: Aug. 14, 2009

(65) Prior Publication Data

US 2011/0037042 A1 Feb. 17, 2011

(51) Int. Cl.
*H01L 21/06* (2006.01)

(52) U.S. Cl. ............................ 438/103; 257/E21.645
(58) Field of Classification Search ............... 438/102, 438/103; 257/E21.645
See application file for complete search history.

(56) References Cited

U.S. PATENT DOCUMENTS

| 7,394,088 | B2 | 7/2008 | Lung |
| 7,595,218 | B2 * | 9/2009 | Ho et al. ........................ 438/95 |
| 2007/0145346 | A1 | 6/2007 | Seidl |
| 2008/0014733 | A1 | 1/2008 | Liu |
| 2008/0054244 | A1 * | 3/2008 | Lee et al. ........................ 257/3 |
| 2008/0099753 | A1 * | 5/2008 | Song et al. ..................... 257/2 |
| 2008/0157053 | A1 | 7/2008 | Lai et al. |
| 2008/0179585 | A1 | 7/2008 | Hsu |
| 2008/0191187 | A1 | 8/2008 | Lung et al. |
| 2008/0308784 | A1 * | 12/2008 | Oh et al. ........................ 257/4 |
| 2009/0130797 | A1 * | 5/2009 | Lee et al. ..................... 438/102 |

* cited by examiner

*Primary Examiner* — Matthew Landau
*Assistant Examiner* — Daniel Luke
(74) *Attorney, Agent, or Firm* — Cantor Colburn LLP; Vazken Alexanian

(57) ABSTRACT

A method for fabricating a phase change memory device including memory cells includes patterning a via to a contact surface of a substrate corresponding to each of an array of conductive contacts to be connected to access circuitry, lining each via with a conformal conductive seed layer to the contact surface, forming a dielectric layer covering the conductive seed layer, and etching a center region of each via to the contact surface to expose the conformal conductive seed layer at the contact surface. The method further includes electroplating phase change material on exposed portions of the conformal conductive seed layer, recessing the phase change material within the center region forming a conductive material that remains conductive upon oxidation, on the recessed phase change material, oxidizing edges of the conformal conductive seed layer formed along sides of each via, and forming a top electrode over each memory cell.

16 Claims, 21 Drawing Sheets

PHASE CHANGE MEMORY DEVICE WITH PLATED PHASE CHANGE MATERIAL

BACKGROUND

The present invention relates to a phase change memory device and a method for fabricating the same, and more specifically, to a phase change memory device employing a liner process for plating the phase change material.

Phase change material has a variety of applications in microelectronic devices such as optical storage media and solid state phase change memory devices. Phase change random access memory (PRAM) devices, for example, store data using a phase change material, such as, for example, a chalcogenide alloy, that transforms into a crystalline state or an amorphous state during cooling after a heat treatment. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1". A current passed through the phase change material creates ohmic heating and causes the phase change material to melt. Melting and gradually cooling down the phase change material allows time for the phase change material to form the crystalline state. Melting and abruptly cooling the phase change material quenches the phase change material into the amorphous state. Currently, phase change materials are formed by various physical methods such as sputtering, chemical vapor deposition (CVD) and physical vapor deposition (PVD). Filling of vias within a phase change memory device at a high aspect ratio can be difficult. For example, the use of a PVD or CVD operation delivers material which may not reach the bottom surface of high aspect ratio vias.

Previously disclosed standard methods for plating include forming a seed layer (e.g., a liner) for the deposition of the phase change material. Although a chemical mechanical polishing could eliminate the excess material, it will not eliminate the short circuit path provided by the liner portion inside the cell, and thus the standard plating method will not be suitable for constructing a phase change memory cell. Other methods including forming a blanket seed layer along a bottom of the phase change material and then building the memory cell. However, if the seed layer is formed underneath all the memory cells, it may short circuit all of the bottom contacts in communication with the memory cells. Therefore, additional etching processes may have to be performed to isolate the memory cells, however, when attempting to shrink the dimensions it may be difficult to perform the latter step, and thus all the memory cells risk of being damaged by the RIE process or being connected together and may not act independently of each other.

SUMMARY

The present invention provides a phase change memory device having a plurality of memory cells which act independently from each other and a fabrication method of the same which includes plating of the phase change material without short circuiting the material.

According to an embodiment of the present invention, a method for fabricating a phase change memory device including a plurality of memory cells is provided. The method includes patterning a via to a contact surface of a substrate corresponding to each of an array of conductive contacts to be connected to access circuitry, lining each via with a conformal conductive seed layer to the contact surface of the substrate, forming a first dielectric layer covering the conformal conductive seed layer, and etching a center region of each via to the contact surface to expose the conformal conductive seed layer at the contact surface. The method further includes electroplating phase change material on exposed portions of the conformal conductive seed layer, recessing the phase change material within the center region of each via, forming a conductive material that remains conductive upon oxidation, on the recessed phase change material, oxidizing edges of the conformal conductive seed layer formed along sides of each via, and forming a top electrode over each memory cell.

According to another embodiment of the present invention, a method for fabricating a phase change memory device including a plurality of memory cells is provided. The method includes patterning a via to a contact surface of a substrate including an oxide layer having an overlying nitride layer formed thereon, the contact surface corresponding to each of an array of conductive contacts, recessing the oxide layer within the via and creating an overhang in the nitride layer overlying the recessed oxide layer, lining each via with a conformal conductive seed layer to the contact surface of the substrate, forming a first dielectric layer covering the conformal conductive seed layer and producing a keyhole within the first dielectric layer formed in the via, and etching the first dielectric layer at a center region of each via to the contact surface to expose the conformal conductive seed layer at the contact surface. The method further includes electroplating phase change material on exposed portions of the conformal conductive seed layer, recessing phase change material within the center region of each via, forming a conductive material that remains conductive upon oxidation, on the recessed phase change material, oxidizing edges of the conformal conductive seed layer formed along sides of each via, and forming a top electrode over each memory cell.

According to another embodiment of the present invention, a phase change memory device having a plurality of memory cells is provided. The phase change memory device includes a substrate having a contact surface with an array of conductive contacts to be connected with access circuitry and a nitride layer formed at the contact surface, a plurality of vias formed through the nitride layer to the contact surface and corresponding to each conductive contact. The vias each include a conformal conductive seed layer lining each via along exposed portions of the nitride layer and the contact surface and having oxidized edges, a dielectric layer deposited and recessed within the conformal conductive seed layer to expose a center region of each via, a phase change material recessed within the center region of each via, and a conductive material, that remains conductive upon oxidation, formed over the phase change material. A top electrode is formed on each memory cell.

According to another embodiment of the present invention, a phase change memory device having a plurality of memory cells is provided. The phase change memory device includes a substrate having a contact surface with an array of conductive contacts to be connected with access circuitry and an oxide layer formed at the contact surface and having a nitride layer formed thereon and a plurality of vias formed to the contact surface and corresponding to each conductive contact. Each via includes a conformal conductive seed layer lining each via along exposed portions of the oxide layer and the contact surface and having oxidized edges, a dielectric layer deposited and recessed within the conformal conductive seed layer to expose a center region of each via, a phase change material recessed within the center region of each via, and a conductive material, that remains conductive upon oxidation, formed over the phase change material. A top electrode is formed on each memory cell.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL
VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
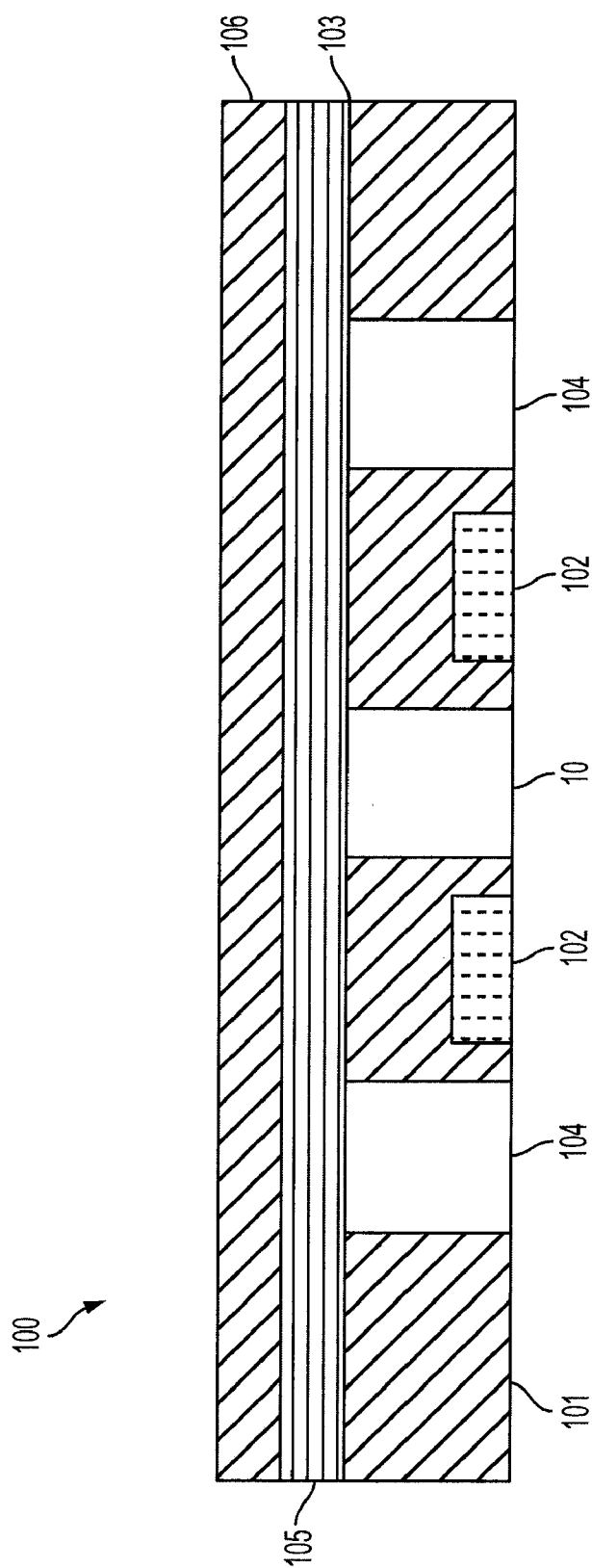
FIG. 1 is a diagram illustrating a fabrication operation of a phase change memory device that can be implemented within embodiments of the present invention.

FIGS. 1 through 11 illustrate a fabrication method for fabricating a phase change memory device according to an embodiment of the present invention. FIGS. 12 through 21 illustrate a fabrication method for fabricating a phase change memory device according to another embodiment of the present invention. Wherever possible, the same reference numerals are used in the drawings and the descriptions of the same or like parts.

Figure 11:
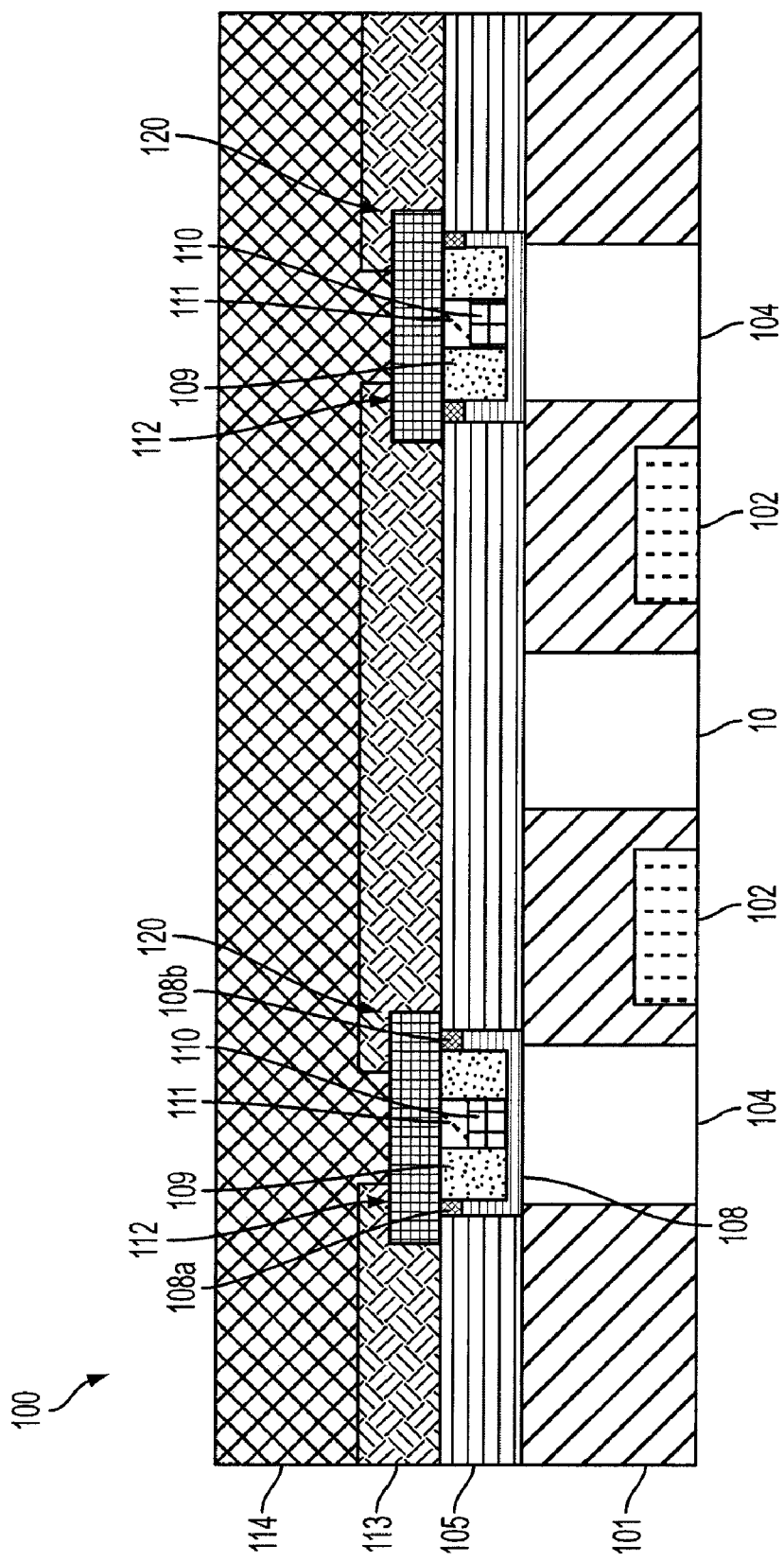
FIG. 11 is a diagram illustrating a phase change memory device fabricated based on the fabrication operations shown in FIGS. 1 through 10 that can be implemented within embodiments of the present invention.

With reference now to FIG. 1, a fabrication operation of a phase change memory device 100 having a plurality of memory cells 120 (as depicted in FIG. 11) according to an embodiment of the present invention is shown. As shown in FIG. 1, a substrate 101 is provided and includes access circuitry (e.g., access transistors) (not shown) for the plurality of memory cells. Word lines 102 connected with gates of the access transistors and a common source line 10 contacts a source region of the access transistors. The substrate 101 further includes a contact surface 103 having an array of conductive contacts 104 to be connected with the access circuitry. According to an embodiment of the present invention, the substrate 101 includes an oxide layer which may be silicon oxide, for example. In alternative embodiments, the substrate 101 may include bulk semiconductor, strained semiconductor, silicon on insulator (SOI), and other commonly used semiconductor substrates. The access circuitry may include transistors such as complementary metal oxide semiconductor (CMOS) or bipolar junction transistors (BJTs) or diodes. A nitride layer 105 is formed on the substrate 101 by a deposition process such as chemical vapor deposition (CVD). The nitride layer 105 may include silicon nitride (SiN) or the like. The nitride layer 105 is of a thickness of approximately 100 nanometers (nm), for example. According to an embodiment of the present invention, the thickness of the nitride layer 105 defines the height of each memory cell 120 of the phase change memory device 100. Next, the dielectric layer 105 is covered by an additional oxide layer 106.

Figure 2:
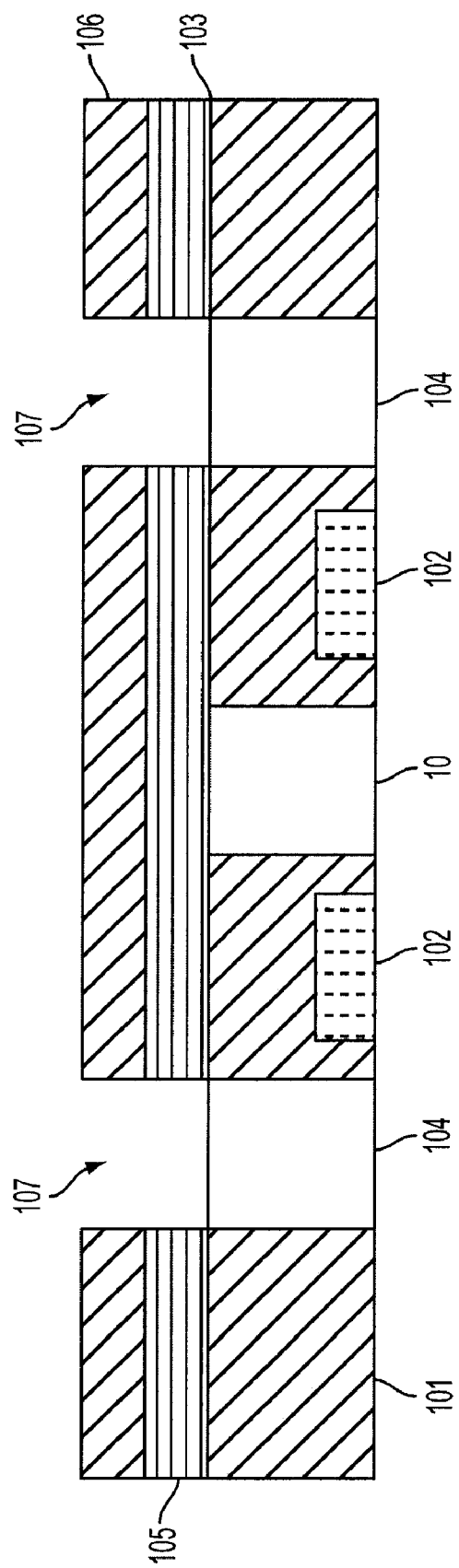
FIG. 2 is a diagram illustrating the formation of vias in the phase change memory device that can be implemented within embodiments of the present invention.

FIG. 2 is a diagram illustrating the formation of vias in the phase change memory device that can be implemented within embodiments of the present invention. As shown in FIG. 2, vias 107 are patterned to the contact surface 103 of the substrate 101 and correspond to respective conductive contacts 104.

Figure 3:
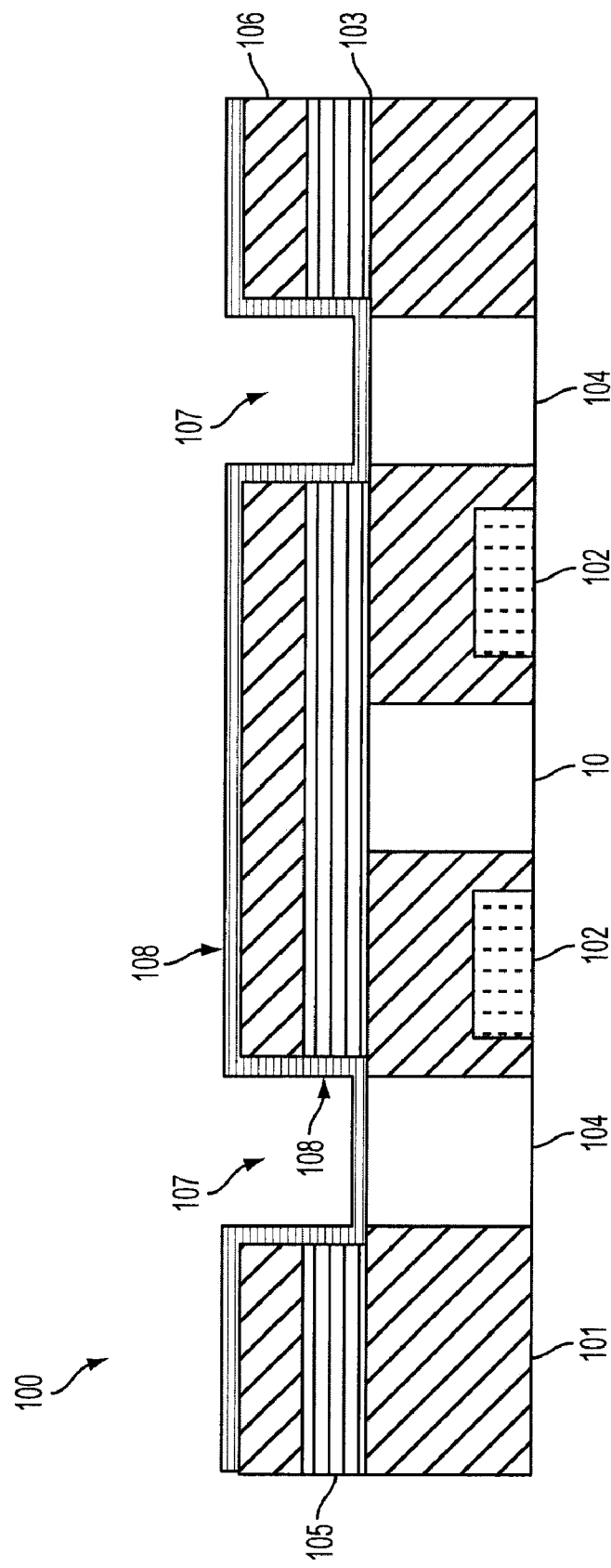
FIG. 3 is a diagram illustrating the formation of a conformal conductive seed layer in the phase change memory device that can be implemented within embodiments of the present invention.

FIG. 3 is a diagram illustrating the formation of a conductive seed layer (e.g., a liner seed) of the phase memory device that can be implemented within embodiments of the present invention. As shown in FIG. 3, a conductive seed layer 108 is blanketly deposited over the oxide layer 106 within the via 107 and the surrounding nitride layer 105 within the via 107, preferably although not exclusively by a chemical vapor deposition (CVD) process or Atomic layer deposition (ALD). According to an embodiment of the present invention, the conductive seed layer 108 is capable of oxidizing and increasing its resistivity in the oxidized region upon application of a suitable oxidizing operation such as oxygen plasma, for example. Thus, according to an embodiment of the present invention, the conductive seed layer 108 may be at least one of titanium nitride (TiN), tantalum nitride (TaN), tungsten (W) or a tantalum-Si nitride (TaSiN) alloy, for example. However, the present invention is not limited hereto and may vary accordingly. As shown in FIG. 3, the conductive seed layer 108 is deposited within each via 107 to the contact surface 103 of the substrate 101.

Figure 4:
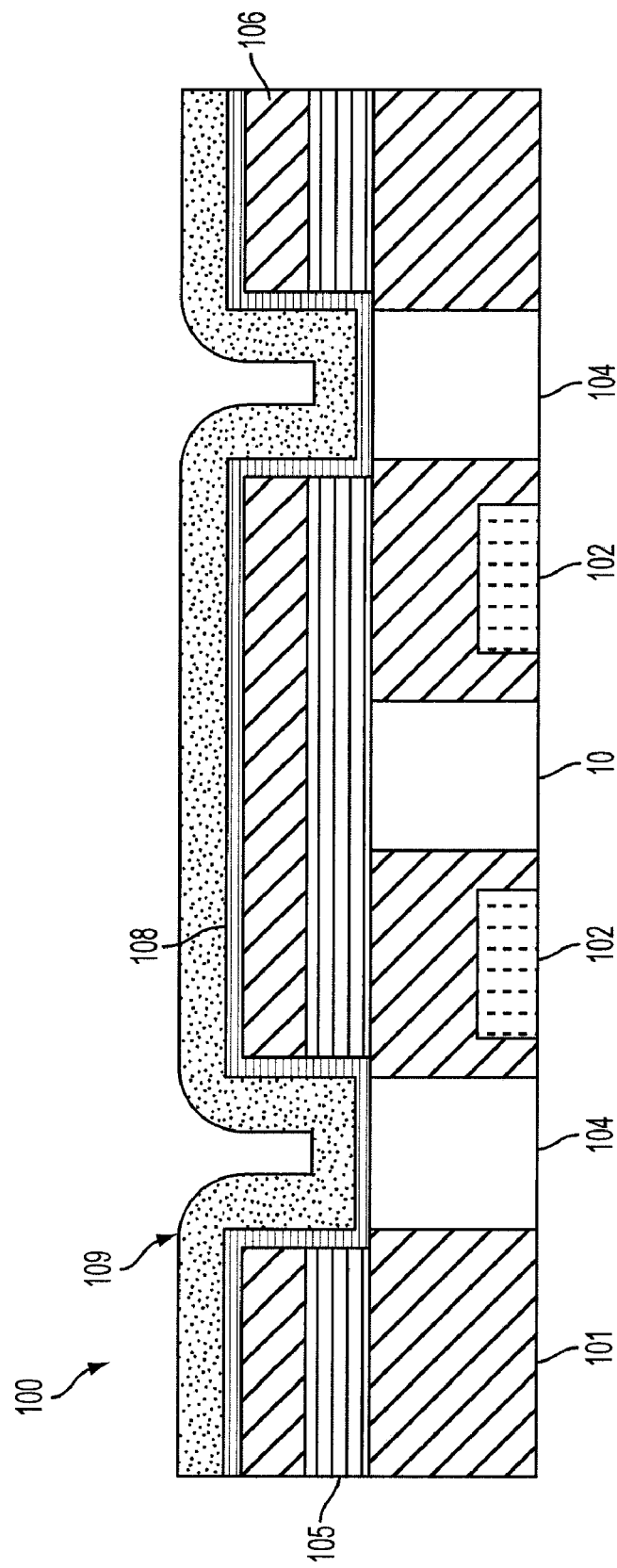
FIG. 4 is a diagram illustrating the formation of a spacer dielectric layer in the phase change memory device that can be implemented within embodiments of the present invention.

FIG. 4 is a diagram illustrating the formation of a spacer dielectric layer of the phase change memory device that can be implemented within embodiments of the present invention. As shown in FIG. 4, a spacer dielectric layer (e.g., a first dielectric layer) 109 is formed covering the conductive seed layer 108. The spacer dielectric layer 109 is of a predetermined thickness ranging from approximately 10 to 100 nanometers (nm). The spacer dielectric layer 108 is of an insulator material in order to isolate the memory cell 120 of the phase change memory device 100 from the conductive sides of the conductive seed layer 108. It also has the role of reducing the critical dimension (CD) of the cell to sub lithographic values.

Figure 5:
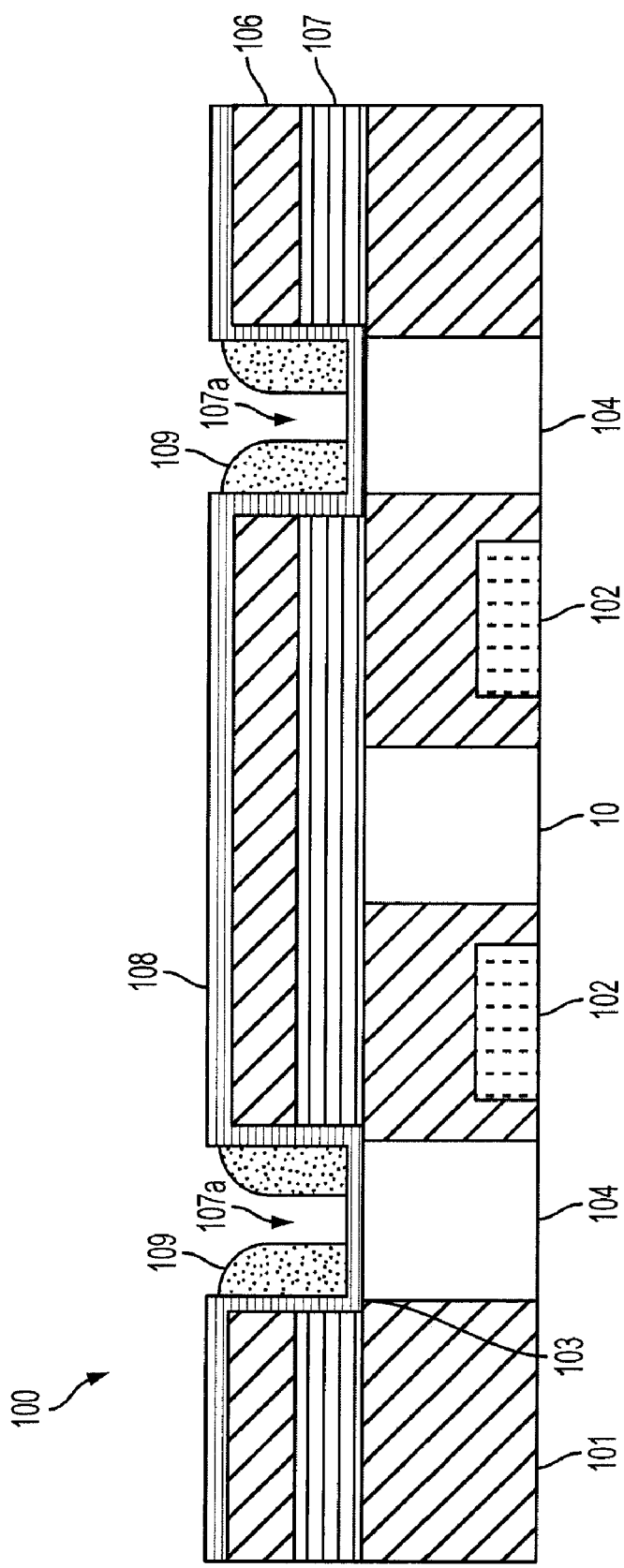
FIG. 5 is a diagram illustrating an etching operation of the spacer dielectric layer in the phase change memory device that can be implemented within embodiments of the present invention.

FIG. 5 is a diagram illustrating an etching operation of the spacer dielectric layer 109 that can be implemented within embodiments of the present invention. As shown in FIG. 5, the spacer dielectric layer 109 is selectively removed to expose a center region 107a of each via 107 to the contact surface 103 of the substrate 100 such that the conductive seed layer 108 at the center region 107a is exposed. The selective removal process is performed by spacer reactive ion etching (RIE) operation (anisotropic etch process), for example. The spacer RIE operation employs argon, fluorine or chlorine high energetic ions to perform the etching process. As used herein, an "anisotropic etch process" denotes a material removal process in which the etch rate in the direction normal to the surface to be etched is higher than in the direction parallel to the surface to be etched. However, the present invention is not limited hereto and any suitable selective removal process for the purpose set forth herein may be performed.

Figure 6:
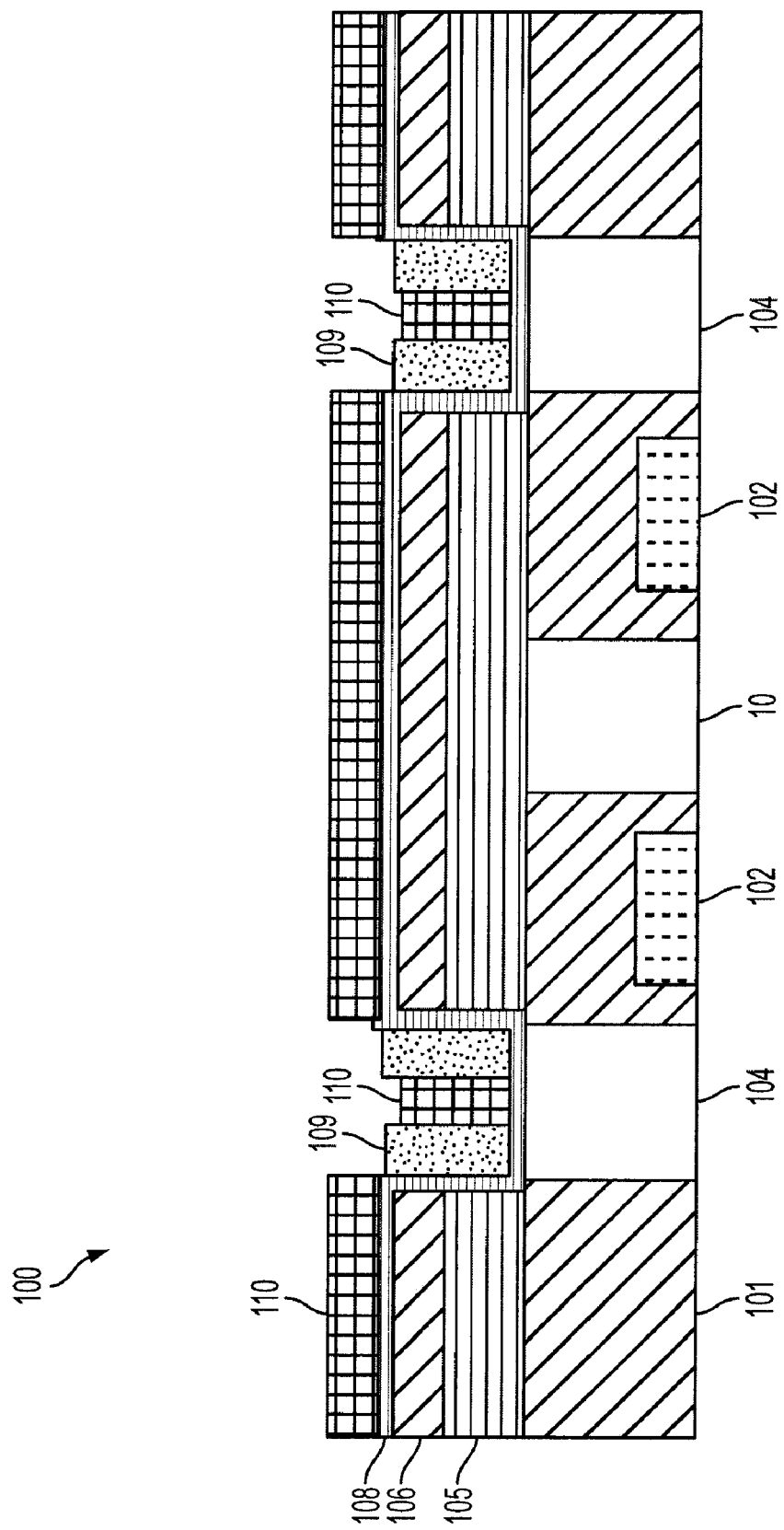
FIG. 6 is a diagram illustrating an electroplating operation of phase change material in the phase change memory device that can be implemented within embodiments of the present invention.

FIG. 6 is a diagram illustrating an electroplating operation of phase change material in the phase change memory device that can be implemented within embodiments of the present invention. As shown in FIG. 6, phase change material 110 such as germanium-antimony-telluride (GeSbTe) is electrodeposited (e.g., electroplated) along exposed portions of the conductive seed layer 108. These exposed portions of the conductive seed layer 108 include a portion of the conductive seed layer 108 formed within the exposed center region 107a of each via 107 such that the phase change material 110 is electrodeposited at the conductive seed layer 108 formed at the contact surface 103 of the substrate 101. That is, as further shown in FIG. 6, the phase change material 110 is electrodeposited along all portions of the conductive seed layer 107 except that which is covered by the spacer dielectric layer 108. The phase change material 110 is not limited to GeSbTe and may vary accordingly. For example, the phase change material 110 may include alloys of gallium(Ga)/Sb, indium (In)/Sb, In/selenium (Se), Sb/Te, Ge/Te, Ge/Sb/Te, In/Sb/Te, Ga/Se/Te, Sn/Sb/Te, In/Sb/Ge, silver (Ag)/In/Sb/Te, Ge/Sb/Se/Te, Te/Ge/Sb/sulfur (S). A wide range of alloy compositions may be used.

Figure 7:
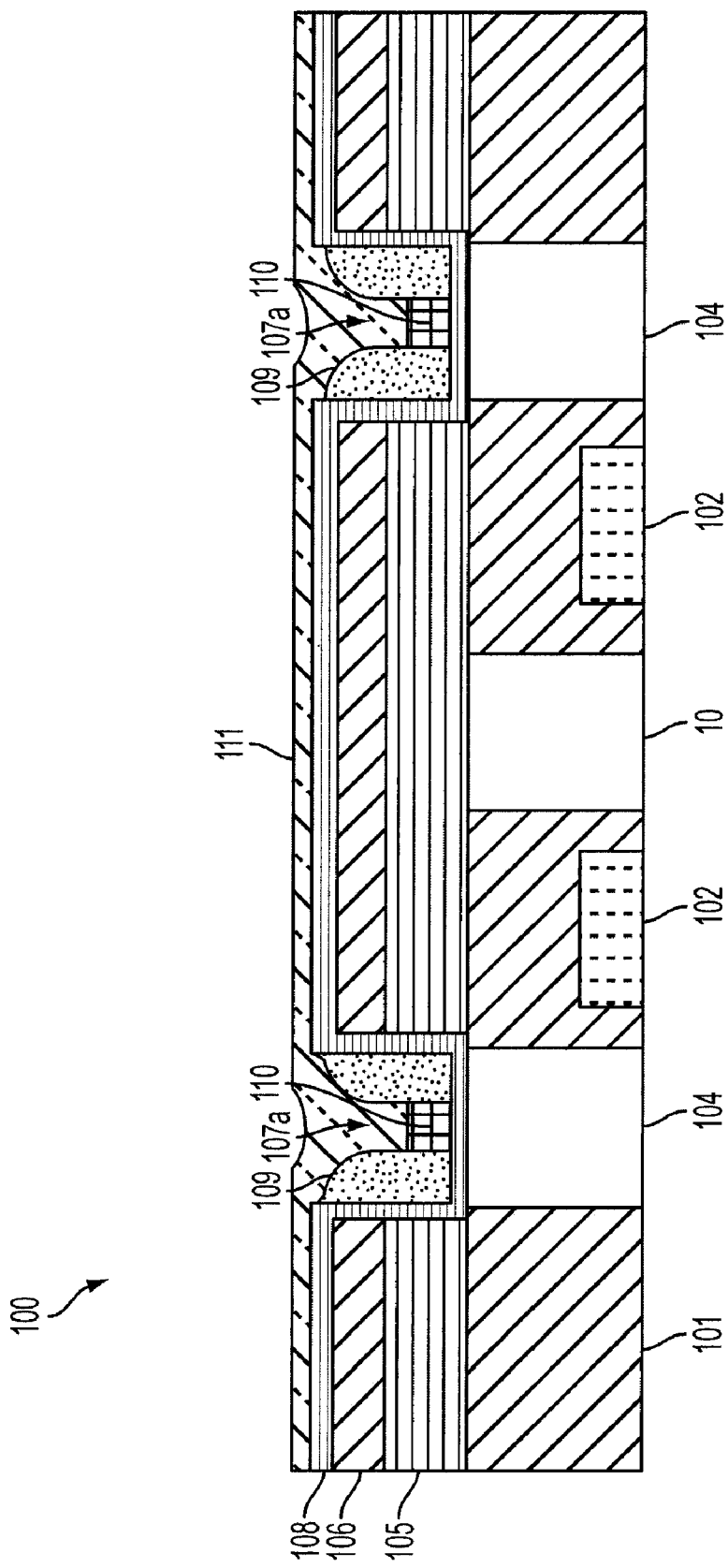
FIG. 7 is a diagram illustrating a recess operation of the phase change material and a deposition operation of conductive material in the phase change memory device that can be implemented within embodiments of the present invention.

FIG. 7 is a diagram illustrating a recess operation of the phase change material and a deposition operation of a conductive material in the phase change memory device that can be implemented within embodiments of the present invention. As shown in FIG. 7, the phase change material 110 is removed from the conductive seed layer 108 and recessed within the center region 107a of each via 107 to a predetermined thickness, via a sputtering process, for example. The predetermined thickness of the phase change material 110 remaining within the center region 107a ranges between approximately 20 to 100 nanometers (nm). After removing and recessing the phase change material 110, a conductive material 111 that remains conductive upon oxidation is deposited along the exposed conductive seed layer 108 and the recessed phase change material 110. According to an embodiment of the present invention, the conductive material 111 may include at least one of ruthenium (Ru) or a similar material that remains conductive upon oxidation.

Figure 8:
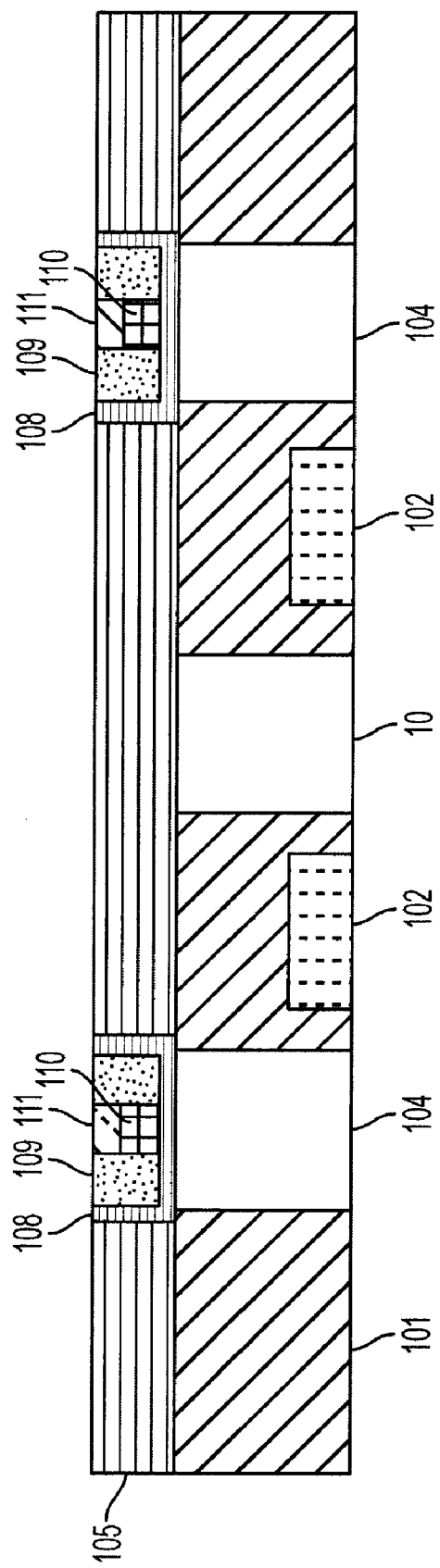
FIG. 8 is a diagram illustrating a planarizing operation of the conductive material in the phase change memory device that can be implemented within embodiments of the present invention.

FIG. 8 is a diagram illustrating a planarizing operation of the fabrication method of the phase change memory device that can be implemented within embodiments of the present invention. As shown in FIG. 8, a planarizing operation such as chemical mechanical polishing (CMP) may be performed to remove excess conductive material 111 and expose a portion of the conductive material 111 covering and directly contacting with the phase change material 110 within via 107. As shown in FIG. 8, the portion of the conductive material 111 directly contacting the phase change material 110 is aligned with the height of the nitride layer 105 which as mentioned, determines the height of each memory cell 120 within the phase change memory device 100.

Figure 9:
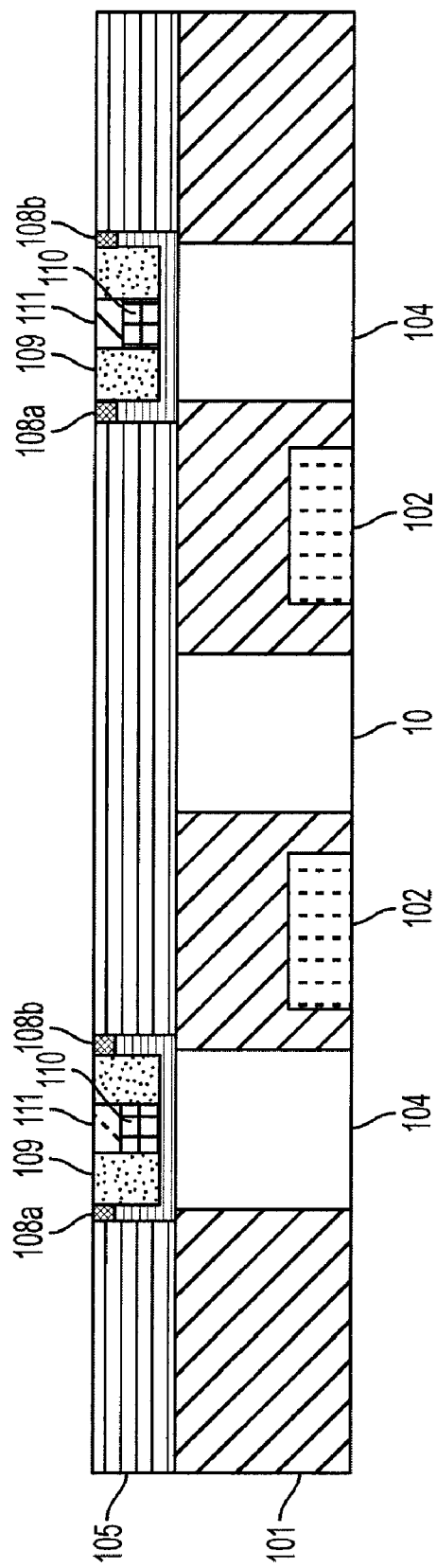
FIG. 9 is a diagram illustrating an oxidation operation of the conformal conductive seed layer in the phase change memory device that can be implemented within embodiments of the present invention.

FIG. 9 is a diagram illustrating an oxidation operation of the conductive seed layer within the phase change memory device that can be implemented within embodiments of the present invention. As shown in FIG. 9, edges 108a and 108b of the conductive seed layer 108 are oxidized and serve as an insulator to prevent current from traveling outside of each memory cell 120 such that current only flows through each memory cell 120 and each memory cell 120 acts independently. The edges 108a and 108b of the conductive seed layer 108 are of a predetermined thickness of approximately 10 to 50 nanometers (nm). Further, as shown in FIG. 9, according to an embodiment of the present invention, the oxidized edges 108a and 108b of the conductive seed layer 108 are adjacent to a top portion of the nitride layer 105.

Figure 10:
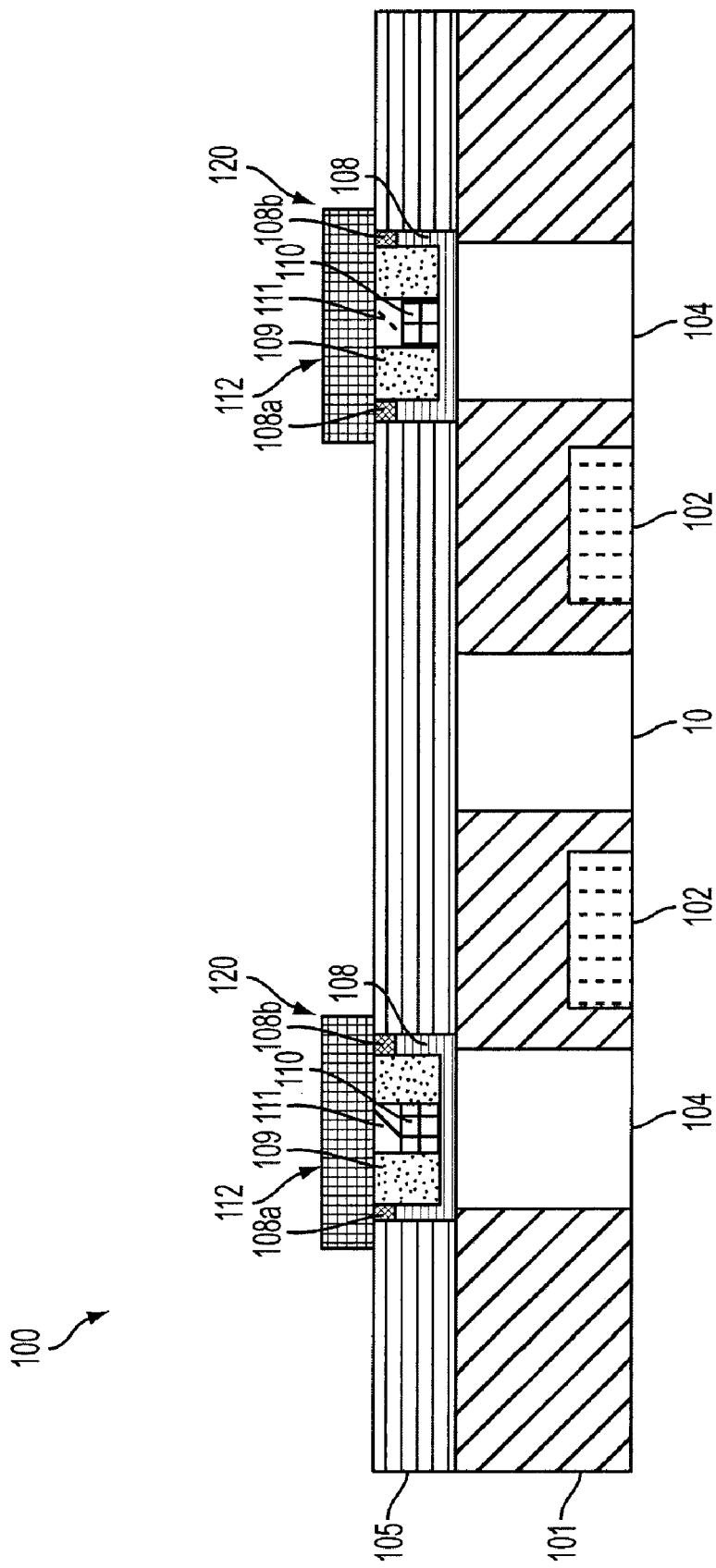
FIG. 10 is a diagram illustrating the formation of a top electrode in the phase change memory device that can be implemented within embodiments of the present invention.

FIGS. 10 and 11 are diagrams respectively illustrating the formation of a top electrode and a top electrode connection in the phase change memory device that can be implemented within embodiments of the present invention. As shown in FIG. 10, a top electrode 112 is formed over each memory cell 120. As shown in FIG. 11, a second dielectric layer 113 is formed over exposed portions of the dielectric layer 104 and the top electrodes 112 formed over each memory cell 120. Next, a top electrode connection layer 114 is formed over an exposed portion of each top electrode 112 and over the second dielectric layer 113. The top electrode connection layer 114 is perpendicular to the conductive contacts 103 formed within the substrate 100. The top electrode 112 receives bit line signals via the top electrode connection 114, and a current path is formed by a bit line, the top electrode 112, the via 107, the conductive seed layer 108, the phase change material 110, and the bottom contact 104 to an access transistor (not shown).

As a result of the fabrication method shown in FIGS. 1 through 11, a phase change memory device 100 including a plurality of memory cells 120 is formed. According to an embodiment of the present invention, the preferred measurements of each memory cell 120 are approximately 300 nanometers (nm) in length and approximately 20-30 nanometers (nm) in width. Thus, according to the current embodiment of the present invention, a phase change memory device 100 having a plurality of memory cells 120 is provided. The phase change memory device 100 includes a substrate 101 having a contact surface 103 with an array of conductive contacts 104 to be connected with access circuitry, a plurality of vias 107 formed to the contact surface 103 and corresponding to each conductive contact 104, each via 107 including a conductive seed layer 108 lining the via 107, a spacer dielectric layer 109 deposited and recessed within the conductive seed layer 108 to expose a center region 107a of each via 107, a phase change material 110 recessed within the center region 107a of each via 107, a conductive material 111, that remains conductive upon oxidation, formed over the phase change material 110, and a top electrode 112 formed on each memory cell 120. Edges 108a and 108b of the conductive seed layer 108 are oxidized to prevent current from traveling outside of side regions of each memory cell 120.

Figure 12:
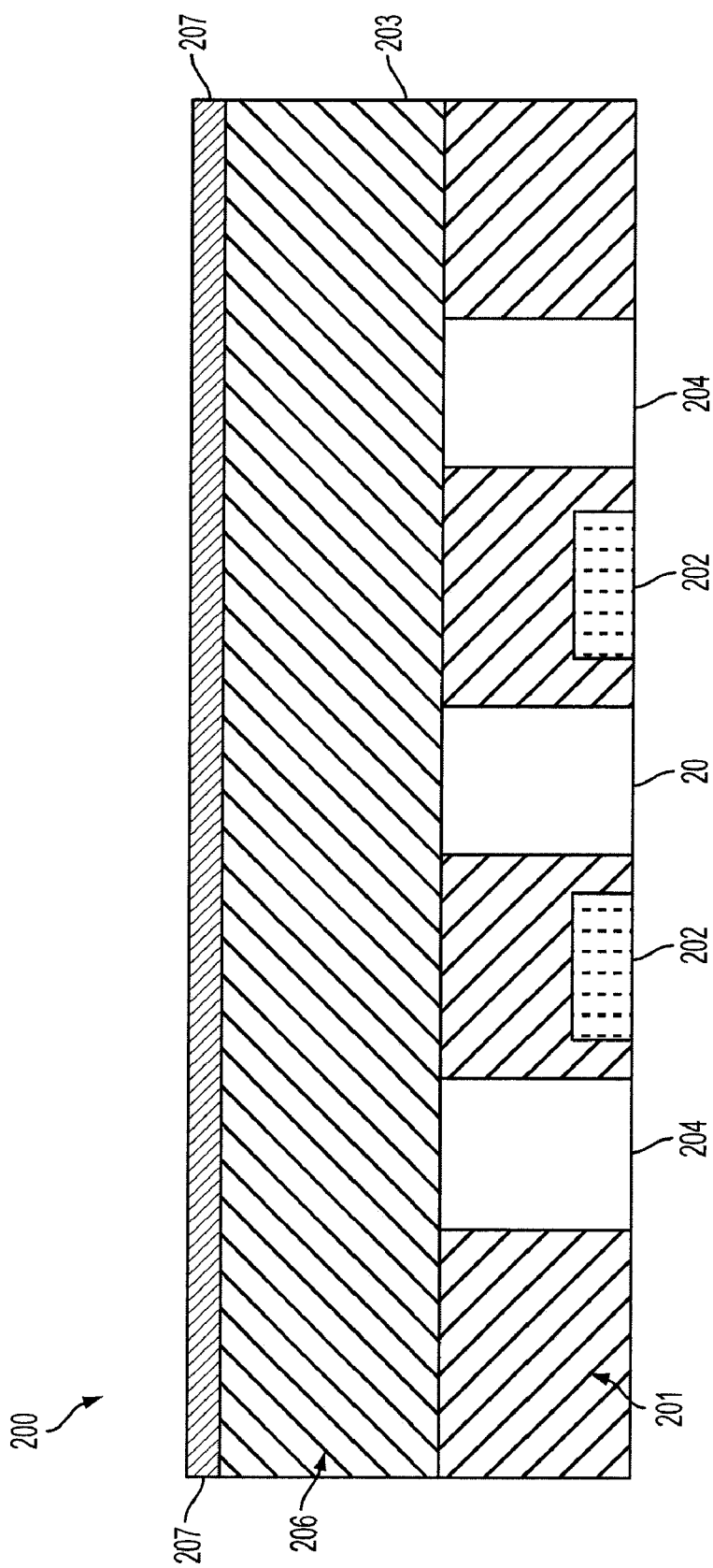
FIG. 12 is a diagram illustrating a fabrication operation of a phase change memory device that can be implemented within alternative embodiments of the present invention.

FIGS. 12 through 21 are diagrams illustrating another fabrication method for fabricating a phase change memory device having a plurality of memory cells that can be implemented within embodiments of the present invention. As shown in FIG. 12, substrate 100 is provided. A substrate 201 is provided and includes access circuitry (i.e., access transistors) for the plurality of memory cells 220 (depicted in FIG. 21). Word lines 202 to be connected with gates of the access transistors are also provided along with a common source line 20 which contacts a source region of the access transistors. The substrate 201 further includes a contact surface 203 having an array of conductive contacts 204 to be connected with the access circuitry. The substrate 201 is made of an oxide layer, for example, and an additional oxide layer 206 is formed at the contact surface 203 of the substrate 201. A nitride layer 207 is then formed over the oxide layer 206.

Figure 13:
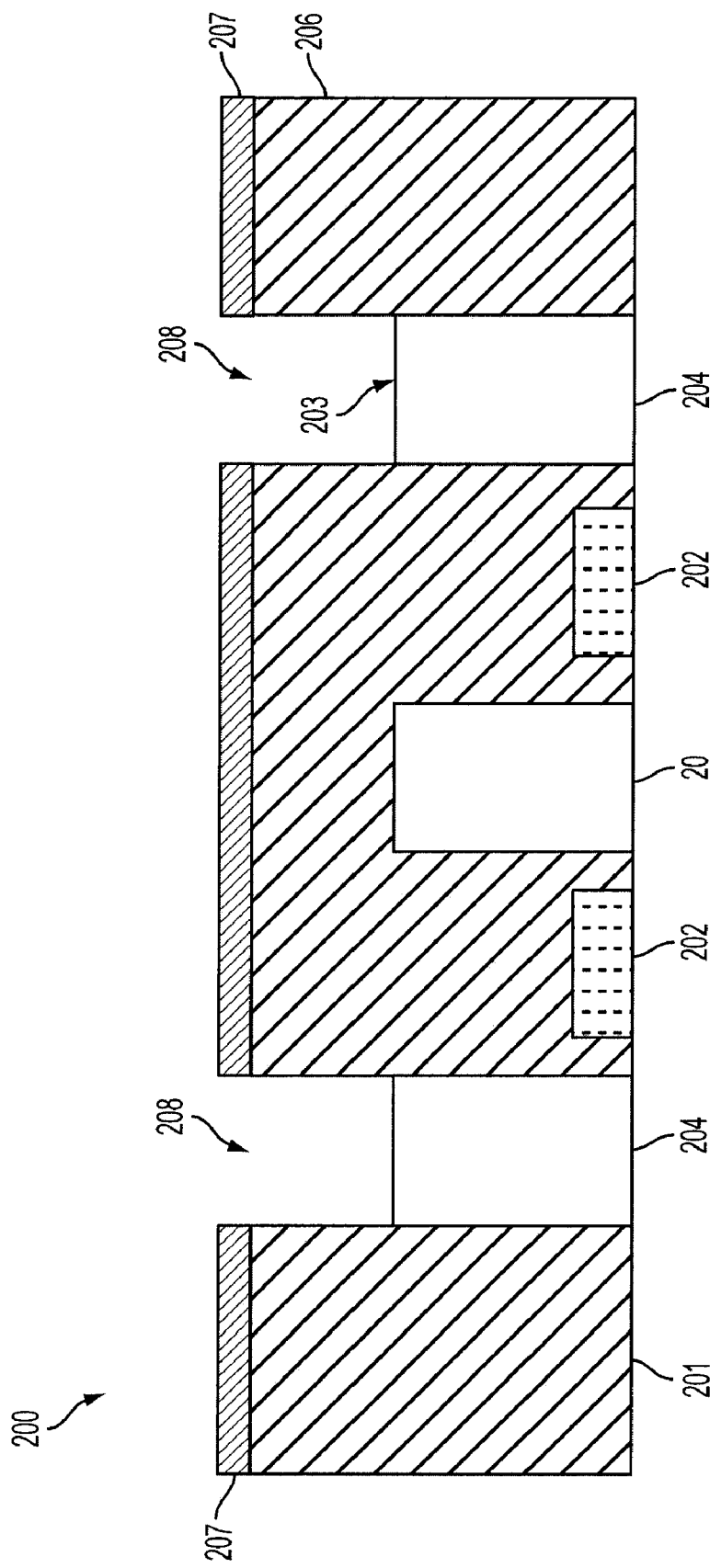
FIG. 13 is a diagram illustrating the formation of vias in the phase change memory device that can be implemented within alternative embodiments of the present invention.

FIG. 13 is a diagram illustrating the formation of vias in the phase memory device that can be implemented within embodiments of the present invention. As shown in FIG. 13, vias 208 are patterned through the nitride layer 207 and the oxide layer 206 to the contact surface 203 of the array of conductive contacts 204.

Figure 14:
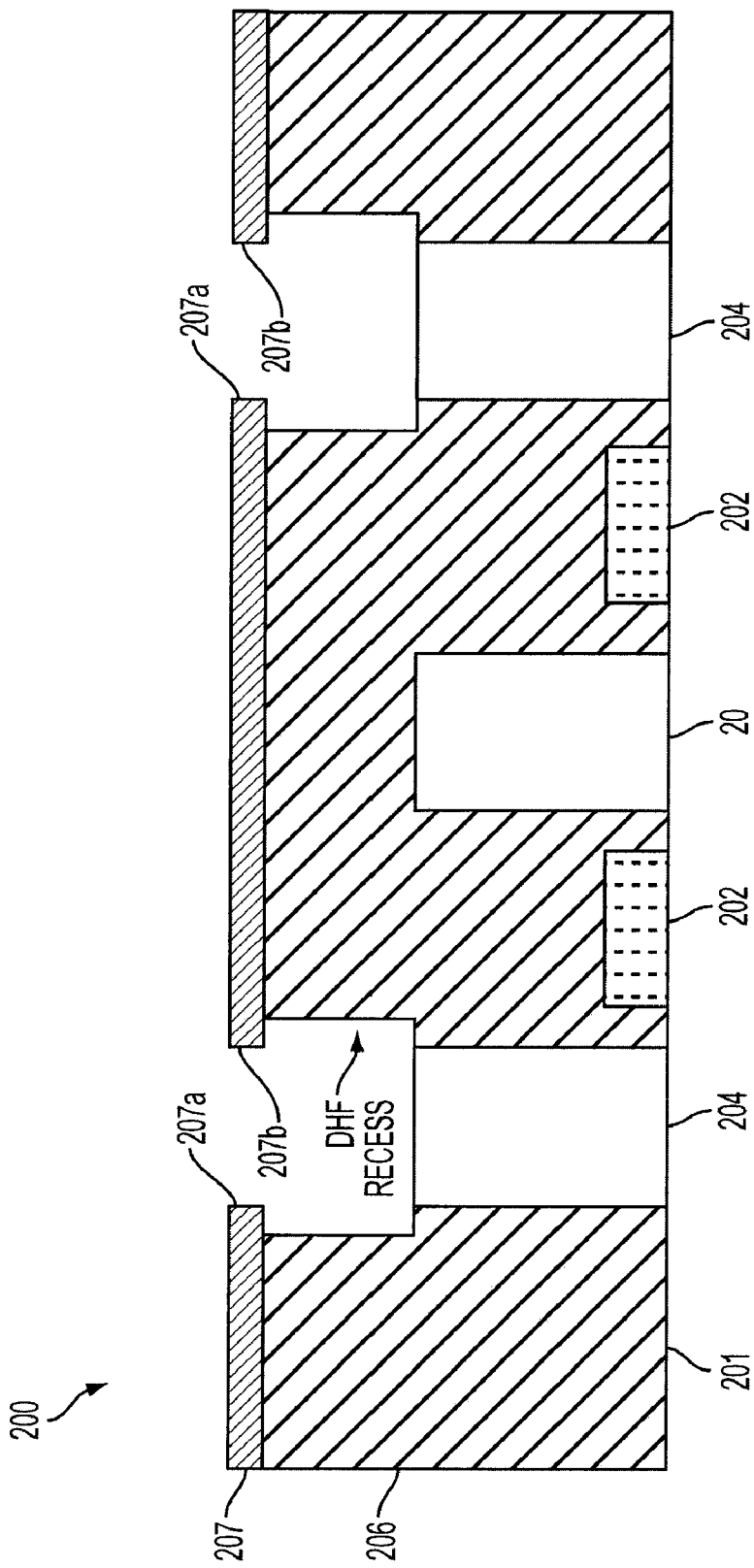
FIG. 14 is a diagram illustrating a recess operation of the vias in the phase change memory device that can be implemented within alternative embodiments of the present invention.

FIG. 14 is a diagram illustrating a recess operation of the vias within the phase change memory device that can be implemented within embodiments of the present invention. As shown in FIG. 14, the oxide layer 206 surrounding the via 207 is recessed via a chemical etching process using a diluted hydrofluoric (DHF) acid, for example, which results in overhang portions 207a and 207b of the nitride layer 207. Since the oxide layer 206 is exposed to the etch only at its vertical sidewalls, the DHF etch laterally recesses the oxide layer 206 thus undercutting the nitride layer 207. The overhang portions 207a and 207b will be used to form a keyhole during subsequent processes with width twice the overhang length, and will act as a hard mask for defining a sub lithographic critical dimension cell size with little dependence on lithographic variations.

Figure 15:
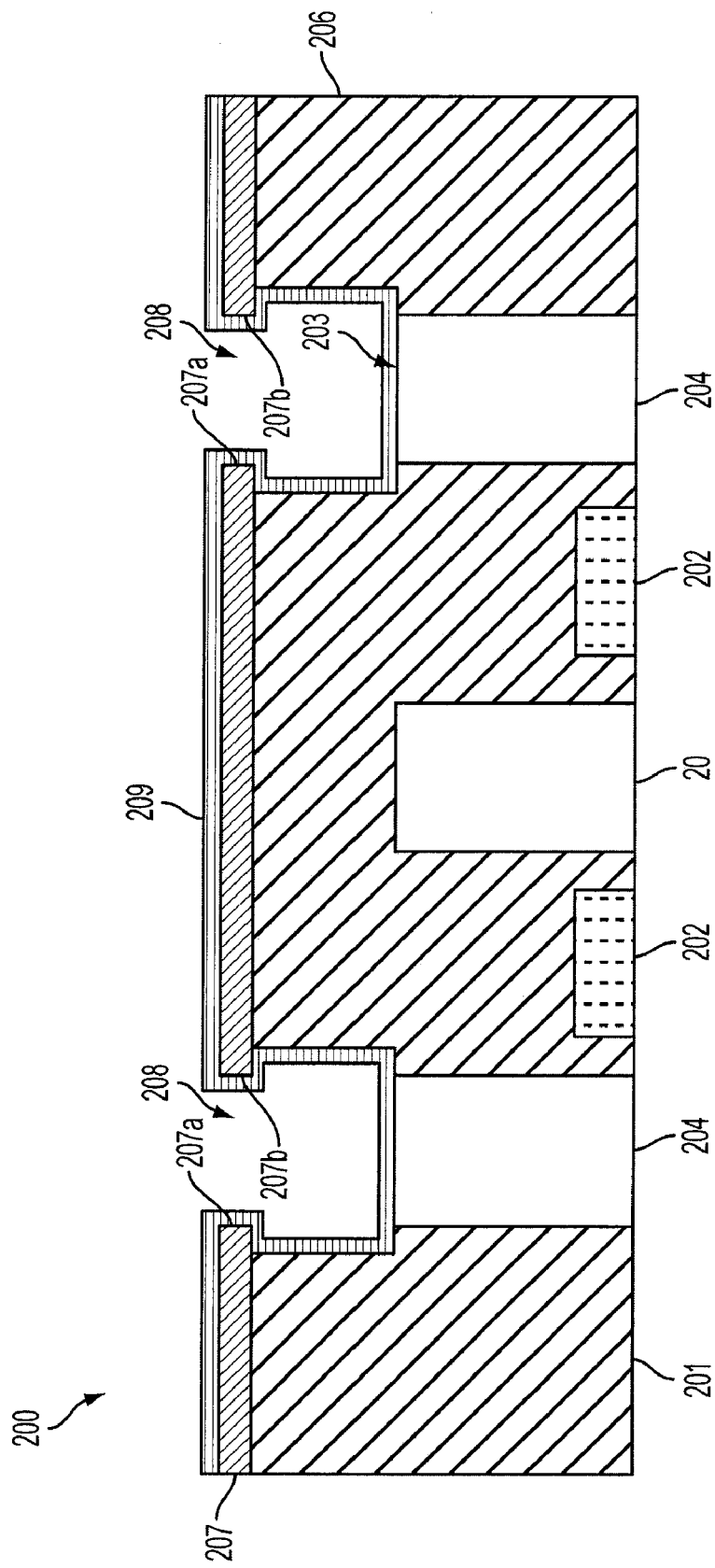
FIG. 15 is a diagram illustrating the formation of a conformal conductive seed layer in the phase change memory device that can be implemented within alternative embodiments of the present invention.

FIG. 15 is a diagram illustrating the formation of a conformal conductive seed layer within the phase change memory device that can be implemented within embodiments of the present invention. As shown in FIG. 15, a conformal conductive seed layer 209 is deposited over the nitride layer 207 and the surrounding oxide layer 206 within each via 208 to the contact surface 203 of the array of conductive contacts 204 within the substrate 201. As shown in FIG. 15, the conformal conductive seed layer 209 reproduces the shape of the overhang portions 207a and 207b of the nitride layer 207. The conductive seed layer 209 may be at least one of titanium nitride (TiN), tantalum nitride (TaN), tungsten (W) or tantalum-silicon nitride (TaSiN) alloy.

Figure 16:
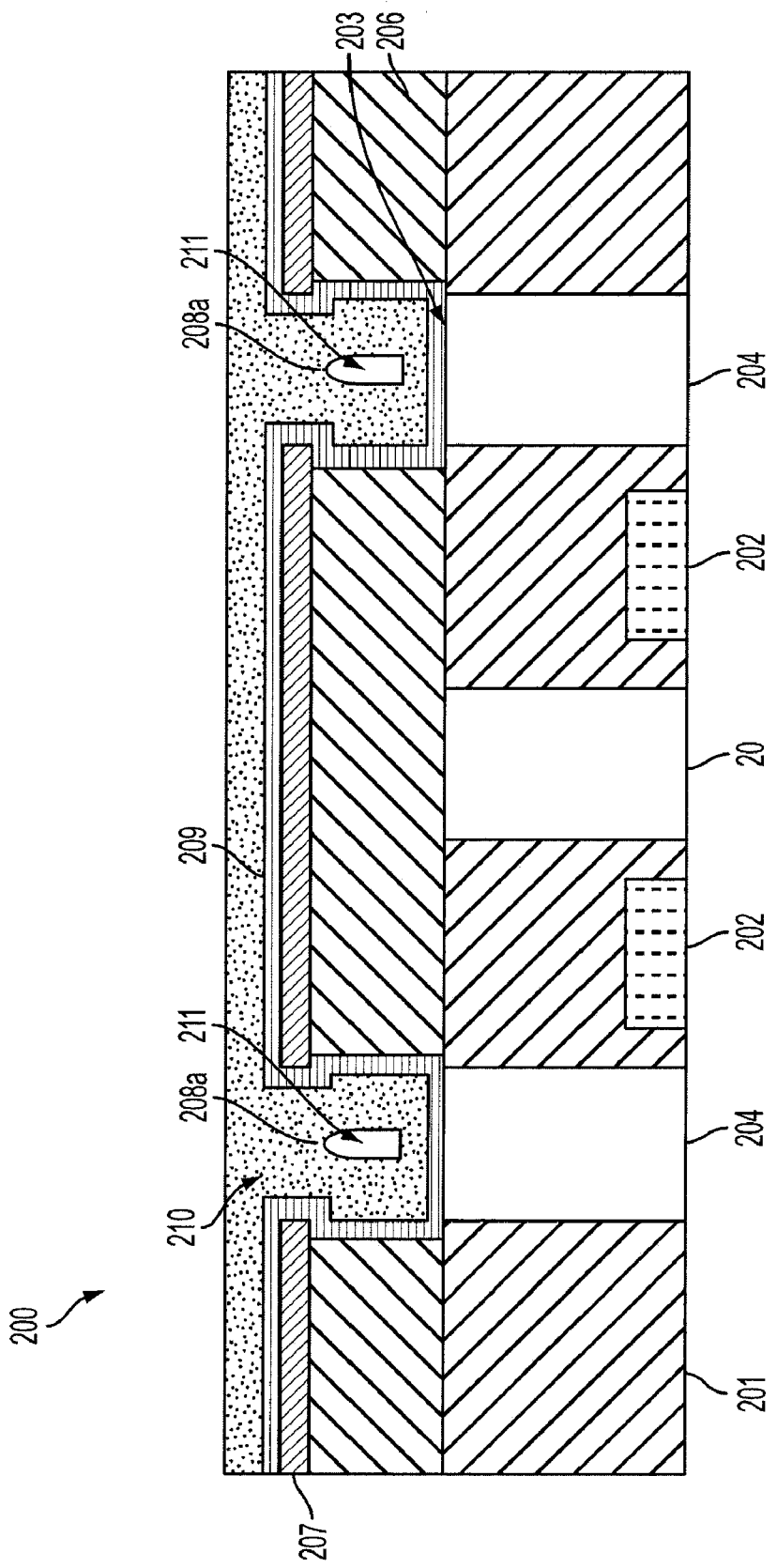
FIG. 16 is a diagram illustrating the formation of a first dielectric layer in the phase change memory device that can be implemented within alternative embodiments of the present invention.

FIG. 16 is a diagram illustrating the formation of a conformal first dielectric layer within the phase change memory device that can be implemented within alternative embodiments of the present invention. As shown in FIG. 16, a conformal first dielectric layer 210 is conformably formed over the conductive seed layer 209. A keyhole 211 is produced within the first dielectric layer 210 formed in each via 208. Each keyhole 211 is formed at a center region 208a of each via 208, and has a width twice the length of the overhang portions 207a, 207b.

Figure 17:
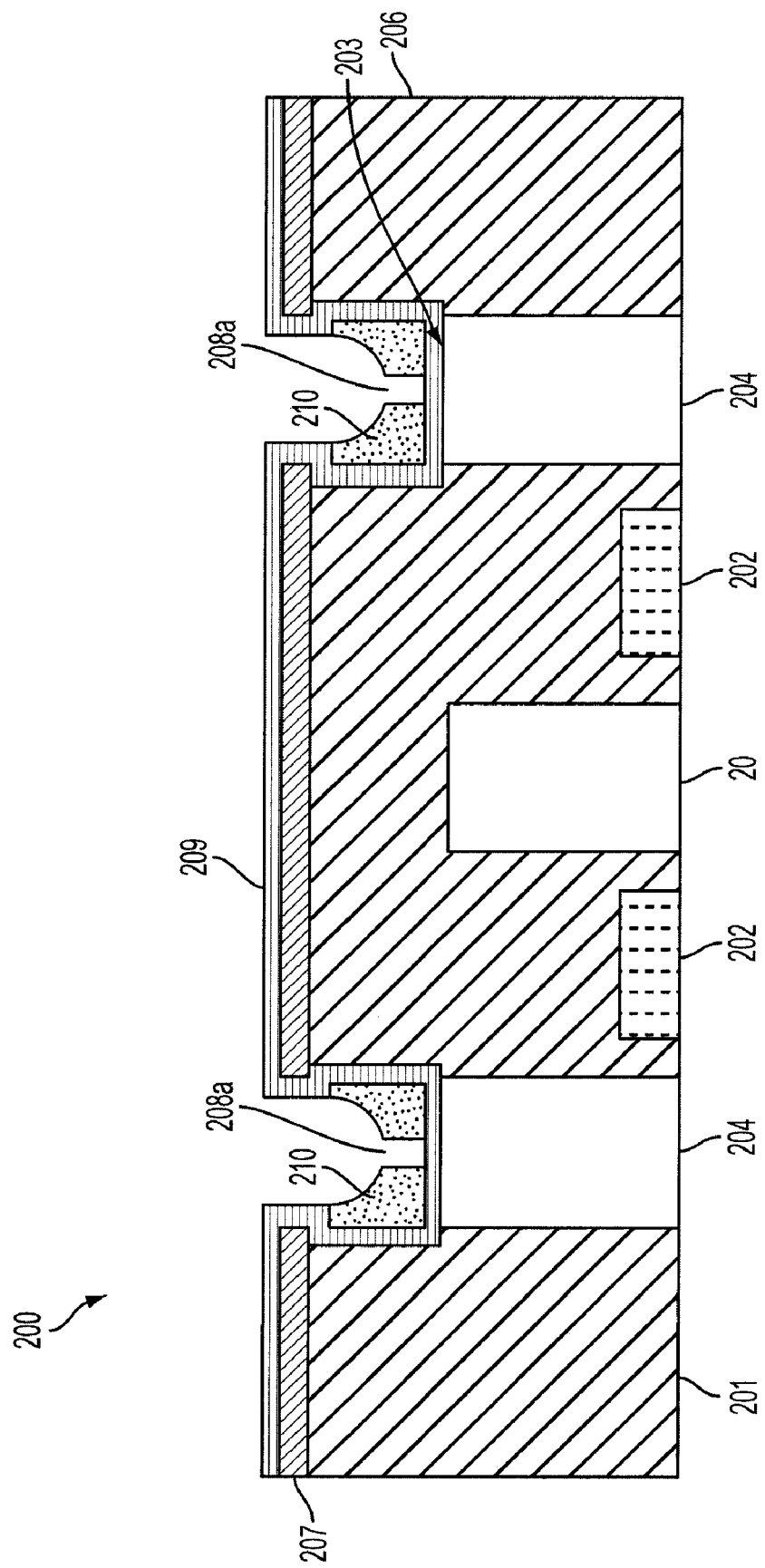
FIG. 17 is a diagram illustrating an etching operation of the first dielectric layer in the phase change memory device that can be implemented within alternative embodiments of the present invention.

FIG. 17 is a diagram illustrating an etching operation of the first dielectric layer within the phase change memory device that can be implemented within embodiments of the present invention. As shown in FIG. 17, portions of the first dielectric layer 210 formed over the conductive seed layer 209 are selectively removed. Specifically, the first dielectric layer 210 is removed from the center region 208a of each via 208 from the keyhole 211 to expose the conformal conductive seed layer 209 at the contact surface 203 corresponding to each conductive contact 204 of the substrate 201.

Figure 18:
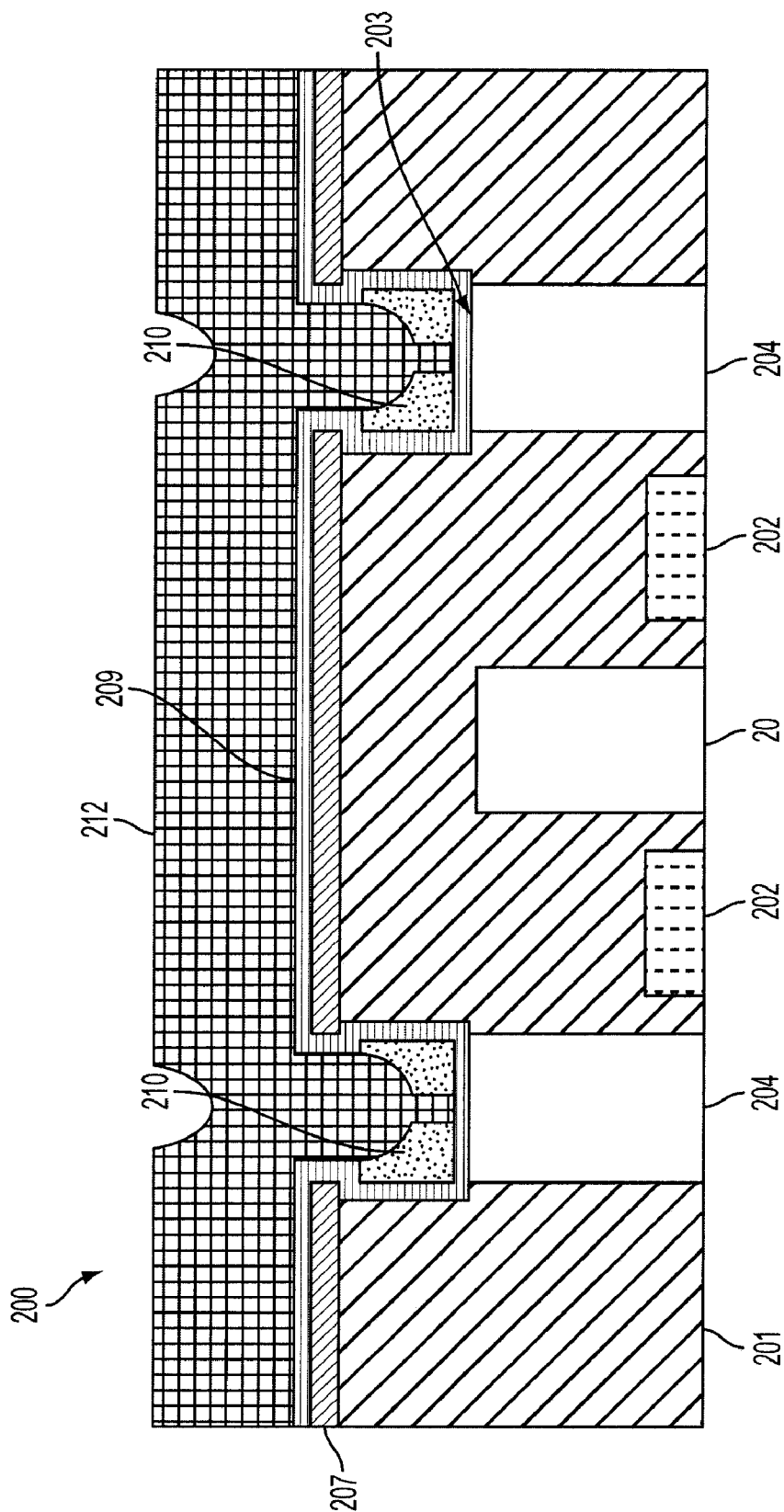
FIG. 18 is a diagram illustrating an electroplating operation of phase change material in the phase change memory device that can be implemented within alternative embodiments of the present invention.

FIG. 18 is a diagram illustrating electroplating operation of phase change material within the phase change memory device that can be implemented within alternative embodiments of the present invention. As shown in FIG. 18, phase change material 212 is electrodeposited (e.g., electroplated) along exposed portions of the conformal conductive seed layer 209.

Figure 19:
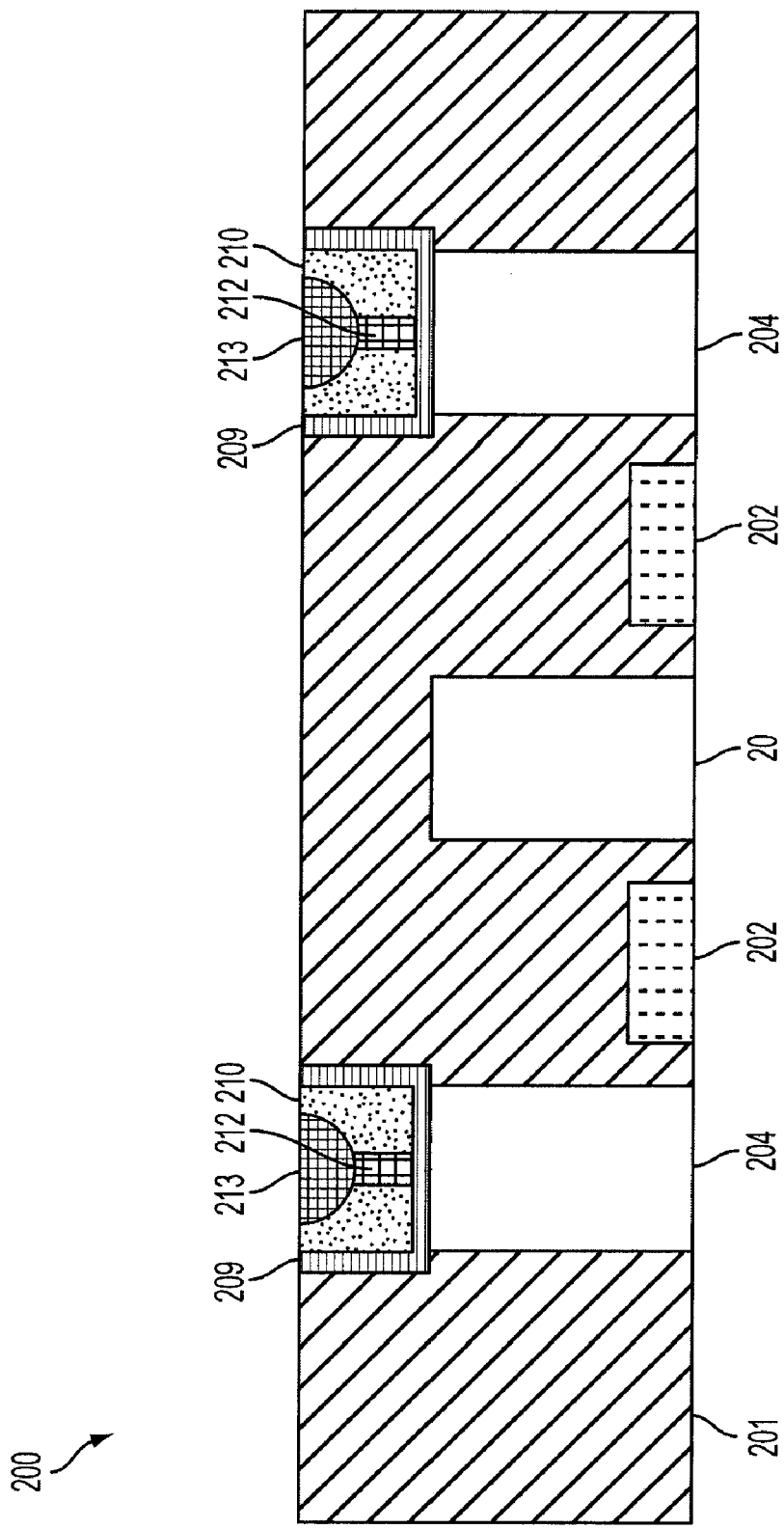
FIG. 19 is a diagram illustrating a recess operation of the phase change material and the deposition of conductive material in the phase change memory device that can be implemented within alternative embodiments of the present invention.

FIG. 19 is a diagram illustrating a recess operation of the phase change material and a deposition operation of a conductive material within the phase change memory device that can be implemented within alternative embodiments of the present invention. As shown in FIG. 19, the phase change material 212 is recessed within each via 206 by an etching operation. Next, a conductive material 213 is formed over exposed portions of the first dielectric layer 210 and the recessed phase change material 212. As mentioned, the conductive material 211 may be at least one of ruthenium (Ru) or ruthenium oxide (RuO). A planarizing process such as a timed chemical mechanical polishing (CMP) operation may be performed to remove excess nitride layer 207, the conformal conductive seed layer 209 and any remaining first dielectric layer 210 formed outside of each via 208 such that the conformal conductive seed layer 209 only remains within each via 208.

Figure 20:
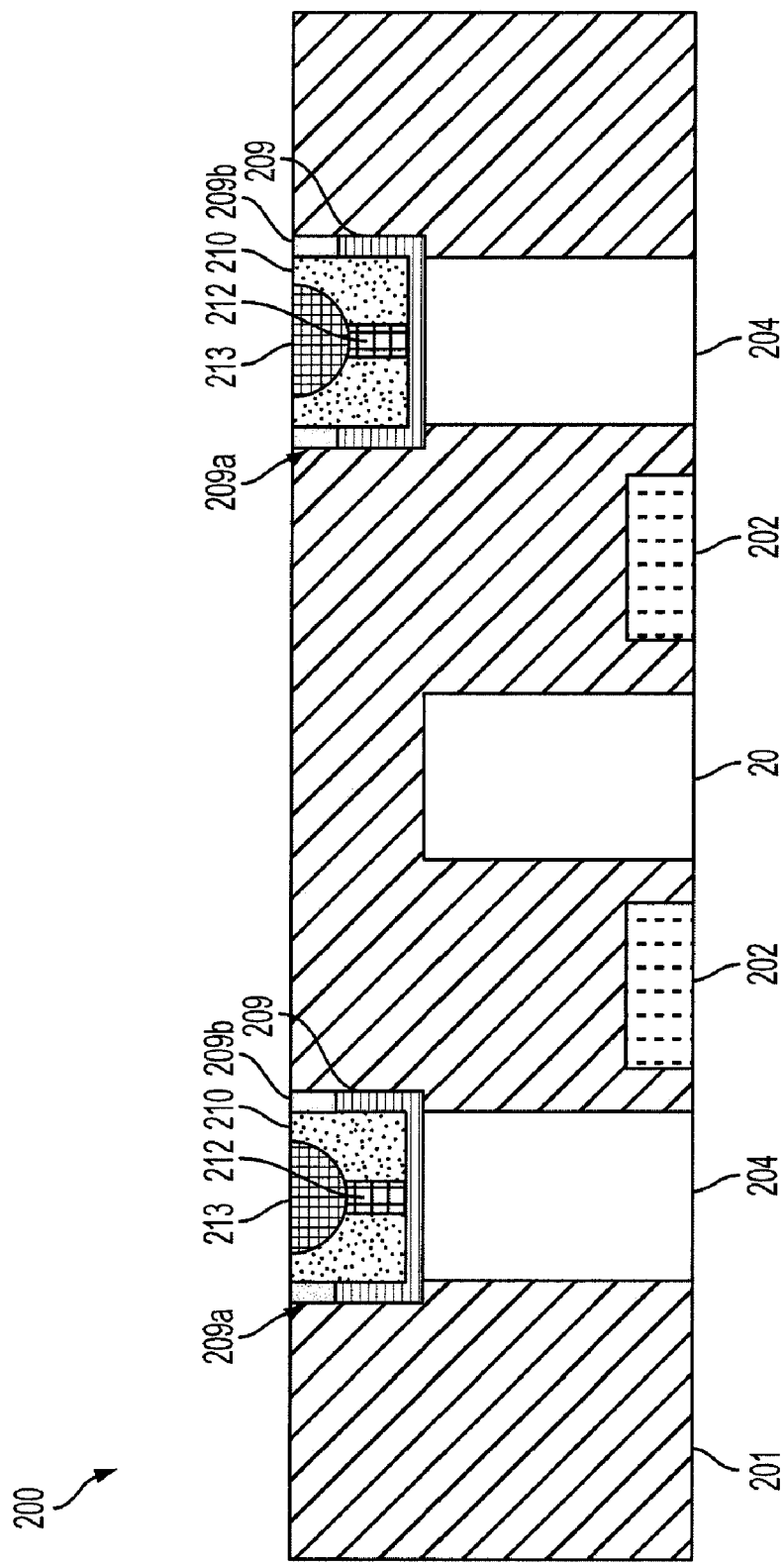
FIG. 20 is a diagram illustrating an oxidation operation of the conformal conductive seed layer in the phase change memory device that can be implemented within alternative embodiments of the present invention.

FIG. 20 is a diagram illustrating a plasma oxidation operation of the conductive seed layer within the phase change memory device that can be implemented within embodiments of the present invention. As shown in FIG. 20, the edges 209a and 209b of the conformal conductive seed layer 209 formed within each via 208 is oxidized via a plasma oxidation operation, for example. Thus, when the conformal conductive seed layer 209 is made of TiN for example, the TiN becomes titanium oxide (TiOx) which is insulating. Therefore, the edges 209a and 209b serve as an insulator to prevent current from traveling through the side regions of the memory cells 220 and allow the current path to travel through each memory cell 220 to the conductive contacts 204.

Figure 21:
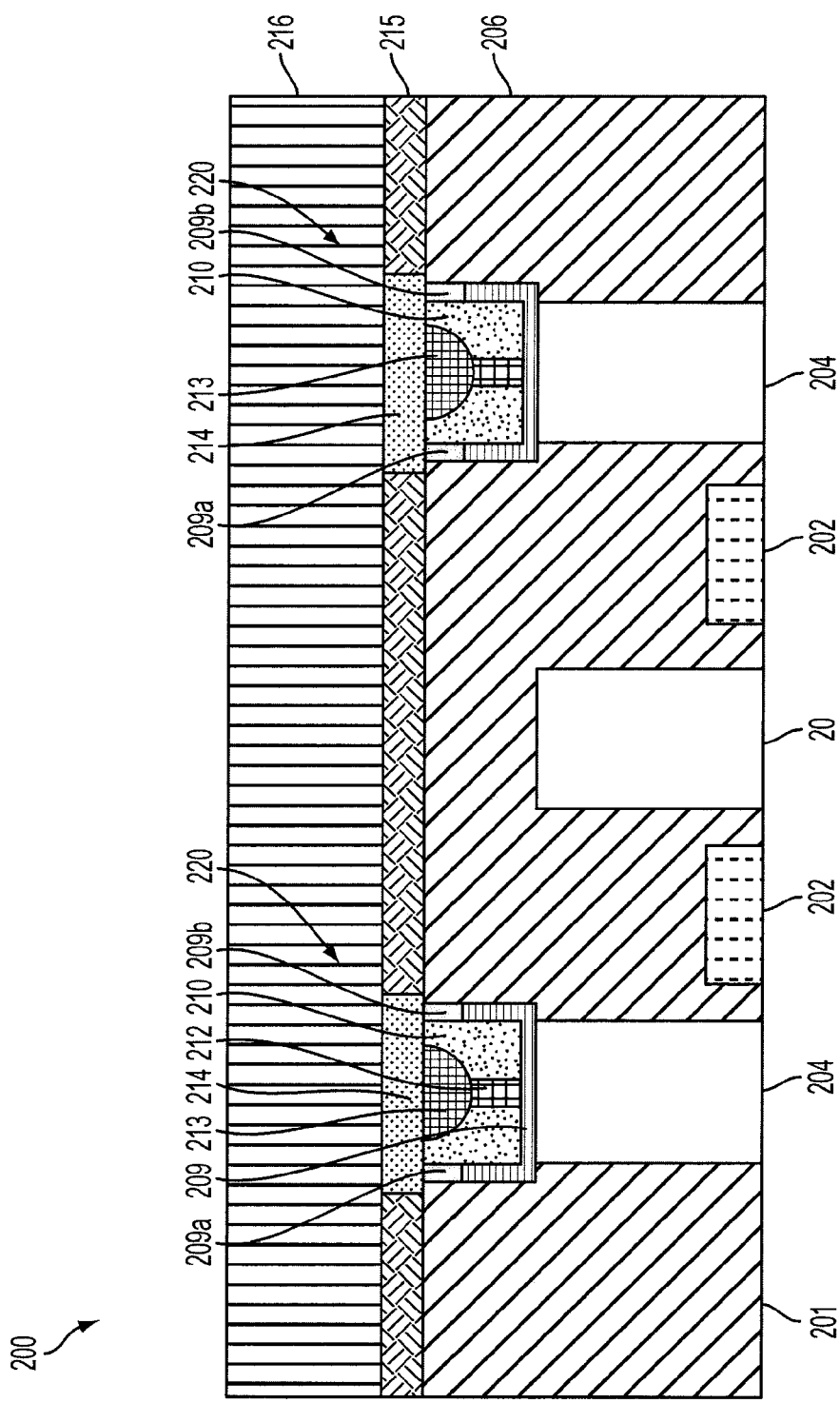
FIG. 21 is a diagram illustrating a phase change memory device fabricated based on the fabrication operations shown in FIGS. 12 through 20 that can be implemented within embodiments of the present invention.

FIG. 21 is a diagram illustrating a phase change memory device fabricated based on the fabrication operations shown in FIGS. 12 through 20 that can be implemented within alternative embodiments of the present invention. As shown in FIG. 21, a top electrode 212 is formed over each memory cell 220. A second dielectric layer 215 is formed along exposed portions of the oxide layer 206 and a top electrode connection layer 216 is formed over the top electrode 212 and the second dielectric layer 214. The top electrode 214 receives bit line signals via the top electrode connection 114, and a current path is formed by a bit line, the top electrode 214, the via 208, the conductive seed layer 209, the phase change material 212 and the bottom contact 204 to an access transistor (not shown).

As a result of the fabrication method shown in FIGS. 12 through 21, a phase change memory device 200 including a plurality of memory cells 220 is formed. According to an embodiment of the present invention, the phase change memory device 200 comprises a substrate 201 having a contact surface 203 with an array of conductive contacts 204 to be connected to access circuitry, a plurality of vias 208 including a conformal conductive seed layer 209 formed at the contact surface 203 and surrounding oxide layer 206, phase change material 212 electroplated within a center region 208a of each via 208, conductive material 213 directly contacting with the phase change material 212 at the center region 208a, the conductive material 213 remaining conductive upon oxidation, and a top electrode 214 formed on each memory cell 220. Edges 209a and 209b of the conductive seed layer 209 are oxidized to prevent current from traveling outside of side regions of each memory cell 220.

Embodiments of the present invention provide a phase change memory device having a plurality of memory cells which act independently from each other therefore keeping cell individuality. The present invention also provides the advantage of preventing current from traveling through side regions of each memory cell by forming a conductive seed layer within each via and oxidizing edges of the conductive seed layer to allow current to travel only through the memory cell to the conductive contact within the substrate.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a phase change memory device including a plurality of memory cells, the method comprising:
    patterning, for each of an array of conductive contacts to be connected to access circuitry, a corresponding via to a contact surface of a substrate;
    lining each via with a conformal conductive seed layer to the contact surface of the substrate;
    forming a first dielectric layer covering the conformal conductive seed layer;
    etching the first dielectric layer at a center region of each via to the contact surface to expose the conformal conductive seed layer at the contact surface;
    electroplating phase change material on exposed portions of the conformal conductive seed layer;
    recessing the phase change material within the center region of each via;
    forming a conductive material that remains conductive upon oxidation, on the recessed phase change material;
    oxidizing edges of the conformal conductive seed layer formed within sides of each via; and
    forming a top electrode over each memory cell.

2. The method of claim 1, further comprising:
    forming a second dielectric layer on the top electrode; and
    forming a top electrode connection layer on the second dielectric layer.

3. The method of claim 1, wherein the conductive seed layer is at least one of titanium nitride (TiN), tantalum nitride (TaN), tungsten (W) or a tantalum-silicon-nitrogen (TaSiN) alloy.

4. The method of claim 3, wherein the first dielectric layer is of a thickness ranging from approximately 10 to 100 nanometers (nm).

5. The method of claim 3, wherein the first dielectric layer is etched using a spacer reactive ion etching (RIE) operation.

6. The method of claim 3, wherein the recessed phase change material is of a predetermined thickness of ranging from approximately 20 to 100 nanometers (nm).

7. The method of claim 3, wherein the conductive material is at least one of Ruthenium (Ru) or Ruthenium oxide (RuO) or other material that remains conductive upon oxidation.

8. The method of claim 3, wherein the oxidized edges of the conformal conductive seed layer are of a predetermined thickness ranging from approximately 10 to 50 nanometers (nm).

9. A method for fabricating a phase change memory device including a plurality of memory cells, the method comprising:

patterning, for each of an array of conductive contacts to be connected to access circuitry, a corresponding via to a contact surface of a substrate having an oxide layer and overlying nitride layer formed thereon;

recessing the oxide layer within each via and creating an overhang in the nitride layer overlying the recessed oxide layer;

lining each via with a conformal conductive seed layer to the contact surface of the substrate;

forming a first dielectric layer covering the conformal conductive seed layer and producing a keyhole within the first dielectric layer formed in each via;

etching the first dielectric layer at a center region of each via to the contact surface to expose the conformal conductive seed layer at the contact surface;

electroplating phase change material on exposed portions of the conformal conductive seed layer;

recessing the phase change material within the center region of each via;

forming a conductive material that remains conductive upon oxidation, on the recessed phase change material;

oxidizing edges of the conformal conductive seed layer formed along sides of each via; and forming a top electrode over each memory cell.

10. The method of claim 9, further comprising:
forming a second dielectric layer on the top electrode; and
forming a top electrode connection layer on the second dielectric layer.

11. The method of claim 9, wherein the conformal conductive seed layer is at least one of titanium nitride (TiN), tantalum nitride (TaN), tungsten (W) or a tantalum-silicon-nitrogen (TaSiN) alloy.

12. The method of claim 9, wherein the first dielectric layer is of a thickness ranging from approximately 10 to 100 nanometers (nm).

13. The method of claim 9, wherein the first dielectric layer is etched using a spacer reactive ion etching (RIE) operation.

14. The method of claim 9, wherein the recessed phase change material is of a predetermined thickness of ranging from approximately 20 to 100 nanometers (nm).

15. The method of claim 9, wherein the conductive material is at least one of Ruthenium (Ru) or Ruthenium oxide (RuO) or other material that remains conductive upon oxidation.

16. The method of claim 9, wherein the oxidized edges of the conformal conductive seed layer are of a predetermined thickness ranging from approximately 10 to 50 nanometers (nm).

* * * * *